United States Patent [19]
Ochiai

[11] Patent Number: 5,378,919
[45] Date of Patent: Jan. 3, 1995

[54] SEMICONDUCTOR INTEGRATED CIRCUIT DEVICE WITH PLURAL GATES AND PLURAL PASSIVE DEVICES

[75] Inventor: Akihiko Ochiai, Kanagawa, Japan

[73] Assignee: Sony Corporation, Tokyo, Japan

[21] Appl. No.: 822,928

[22] Filed: Jan. 21, 1992

[30] Foreign Application Priority Data

Jan. 21, 1991 [JP] Japan .................................. 3-019138

[51] Int. Cl.[6] ...................... H01L 29/78; G11C 11/24
[52] U.S. Cl. .................................. 257/204; 257/303; 257/350; 257/379; 365/148; 365/149
[58] Field of Search ............... 257/204, 350, 347, 379, 257/296, 303

[56] References Cited

U.S. PATENT DOCUMENTS

| | | | |
|---|---|---|---|
| 3,407,479 | 10/1968 | Fordemwalt et al. | 257/204 |
| 4,791,610 | 12/1988 | Takemae | 365/149 |
| 4,803,178 | 2/1989 | McCaughan | 257/350 |
| 4,866,291 | 9/1989 | Shimada et al. | 257/350 |
| 4,893,158 | 1/1990 | Mihara et al. | 257/350 |
| 5,101,251 | 3/1992 | Wakamiya et al. | 257/379 |

FOREIGN PATENT DOCUMENTS

| | | | |
|---|---|---|---|
| 63-119578 | 5/1988 | Japan | 257/347 |
| 63-142851 | 6/1988 | Japan | 257/347 |
| 02275663 | 11/1990 | Japan | |

OTHER PUBLICATIONS

IBM Technical Disclosure Bulletin, vol. 35, #2, Jul. 1992, pp. 37-38, "Method to Form Very Thin $So_2$ Films".

IBM Technical Disclosure Bulletin, vol. 35, #2, Jul. 1992, pp. 247-249, "Process for Fabrication of Very Thin Epitaxial Silicon Films Over Insulating Layers".

Primary Examiner—Rolf Hille
Assistant Examiner—Mahshid Saadat
Attorney, Agent, or Firm—Hill, Steadman & Simpson

[57] ABSTRACT

In a sea-of-gate structure gate array in which a plurality of logic gates are arrayed on a semiconductor chip, resistance devices or capacitive devices are formed without reducing the gate scale to form analog components to render the gate array into a hybrid gate array including the analog components. A number of MOS transistors to be formed without vacancies on the chip surface are formed in a thin silicon section on an insulating layer 15. The logic gates arrayed on the chip is of the SOI structure. Below the insulating layer 15, a lower capacitor electrode 12, a dielectric film 13, an upper capacitor electrode 14 and a resistance element are formed so as to be buried in an insulating film 11 on a supporting substrate 10 or in an insulating substrate. The capacitor and the resistance are led to the chip surface by means of a contact hole 23 provided in the insulating layer 15. A grinding stop 16 is formed in the insulating layer 15. The thin silicon section of the SOI structure is produced by grinding the substrate.

5 Claims, 5 Drawing Sheets

SEMICONDUCTOR INTEGRATED CIRCUIT DEVICE WITH PLURAL GATES AND PLURAL PASSIVE DEVICES

BACKGROUND OF THE INVENTION

1. Field of the Invention

This invention relates to a semiconductor integrated circuit device and, more particularly, to a gate array of a silicon-on-insulator (SOI) construction.

2. Description of Related Art

A gate array is frequently employed as one of ICs devoted to particular applications. The gate array has a construction comprised of a matrix array of basic logical gates on a semiconductor chip, and is marketed after metallization adapted to the user's requests.

The gate array construction is roughly divided into two types, one being a channel construction having a gate region and a channel region for metallization in the gate region, and the other being a channel-less construction having transistors laid on its entire surface without vacancies, sometimes referred to as a sea-of-gates (SOG).

Figure 12:
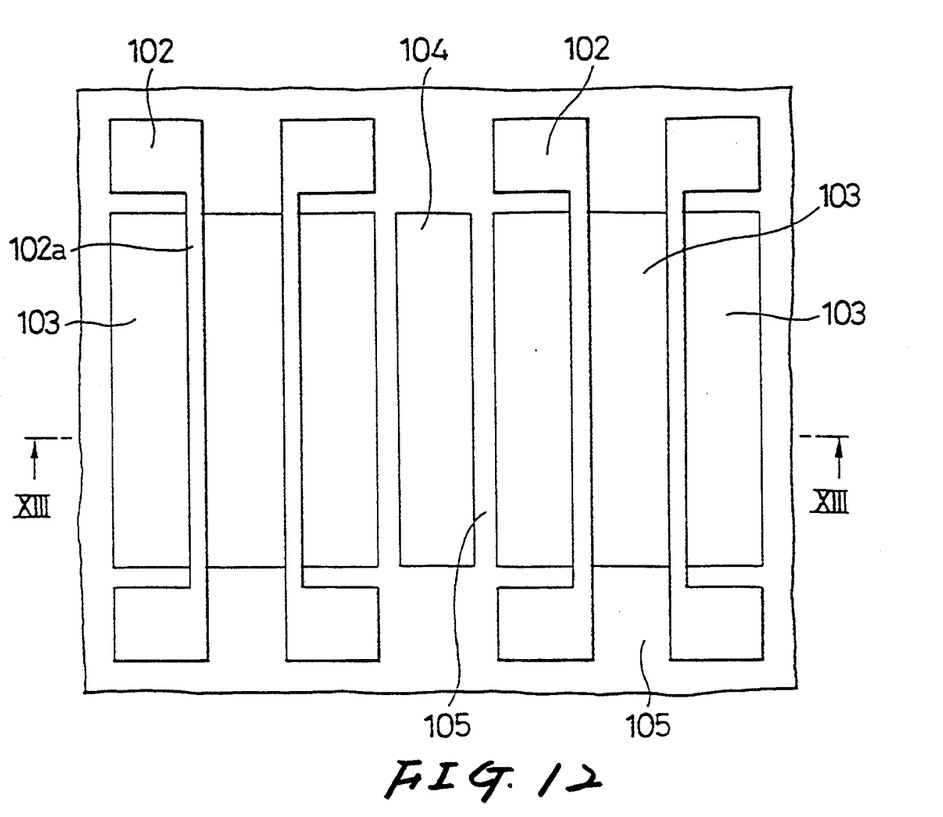
FIG. 12 is a plan view showing essential parts of a conventional typical gate array.
Figure 13:
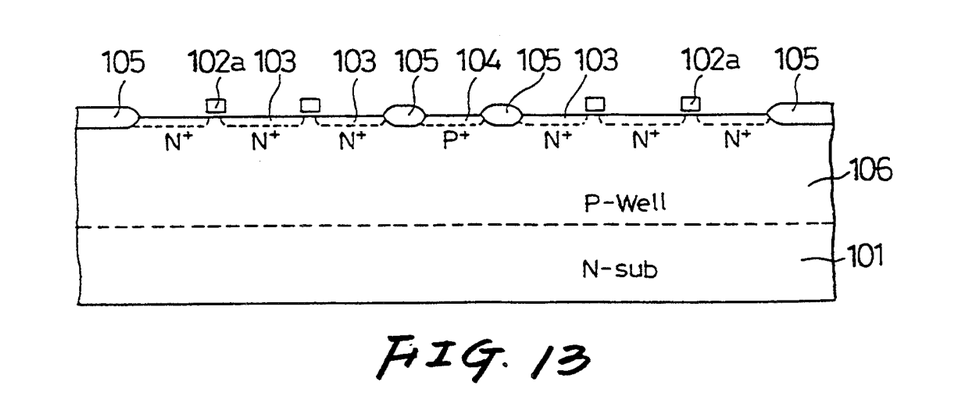
FIG. 13 is a cross-sectional view along line XIII—XIII of FIG. 12.

FIGS. 12 and 13 show a part (an nMOS section) of a typical conventional gate array. In FIG. 12, a layer patterned to a substantially U-shape on a well (substrate) is a gate electrode 102 of an nMOS transistor, source drain regions 103, 103 of which are formed on both sides of a narrow strip-like region 102a interconnecting both enlarged end sections functioning as wiring or metallization. Each basic unit cell is constituted by a pair of the gate electrodes 102, 102 having the enlarged end sections extending in alternately opposite directions. Each basic unit cell is surrounded by a device isolating region (LOCOS region) 105 when seen in a plan view. A region 104 defined between two adjoining basic unit cells is used for contacting with a (substrate). FIG. 13 is a cross-section taken along line XIII—XIII in FIG. 12. A p-type well region 106 is formed on an n-type silicon substrate 101. The source drain regions 103 are n+ type impurity diffusion regions in the p-type well region 106, whilst the region 104 is a p+ type impurity diffusion region.

In consideration of the demand for high integration and higher layout efficiency, the recent tendency is to use the channel-less gate array in preference to the channel gate array. As far as circuit performance is concerned, an analog hybrid type has also become known, which is adapted for dealing not only with digital signals but also with analog signals, as reported for example in NIKKEI ELECTRONICS, No. 484, page 122 to 123, published by NIKKEI BP KK.

Meanwhile, although the gate scale is increased markedly with the channel-less gate array, a problem is presented that, when the hybrid system channel-less gate array is to be implemented, the gate scale is diminished. That is, although capacitance or resistance devices may be built in a metallization area in a channel type gate array, there is no region dedicated to metallization in the channel-less gate array, so that how to array capacitive or resistance devices for analog components raises a problem. If the capacitive or resistance devices are forcedly formed on a chip, the number of the logic gates is diminished in an amount corresponding to an area taken up by these devices, thus obstructing the increase of the gate scale.

OBJECT AND SUMMARY OF THE INVENTION

In view of the above described status of the art, it, is an object of the present invention to provide a semiconductor integrated circuit system in which resistance or capacitance devices as analog components may be formed without diminishing the gate scale.

For accomplishing the above object, the present invention provides a semiconductor integrated circuit device comprising a supporting substrate, a second device-forming region made up of a semiconductor layer or a conductive layer formed on said supporting substrate, a first device-forming region which is formed by grinding a substrate and in which a logic gate is arrayed, and an insulating layer formed between said first device-forming region and said second device-forming region and provided with a grinding stop for stopping substrate grinding, said first device-forming region and said second device-forming region being electrically connected to each other at certain regions.

The logic gate of the first device-forming region may be a MIS transistor and the element formed in the second device-forming region may be a resistance device, a capacitive device or a combination thereof, The MIS transistor may be formed on the entire surface of the first device forming region.

Since the insulating layer is provided with the grinding stop, the first device-forming region may be set to a predetermined thickness when the first device-forming region is formed by wafer grinding. Besides, since the insulating layer is provided between the first device-forming region and the second device-forming region provided on the supporting substrate, the SOI structure may be provided by the combination of the first device-forming region with the insulating layer. The second device-forming region is stacked on the first device-forming region with the insulator in-between. Thus, by forming the capacitive element and/or the resistance element in the second device-forming region and arraying the logic gate in the first device-forming region, the capacitive device and/or the resistance device may be formed on one and the same semiconductor chip without diminishing the scale of the logic gate.

With the present semiconductor integrated circuit device, the SOI structure may be provided by the combination of the first device-forming region with the insulating layer, with the second device-forming layer being stacked on the first device-forming region with the insulating layer in-between. High circuit density may be achieved because the first device-forming region in which the logic gate is arrayed is of the SOI structure.

DESCRIPTION OF THE PREFERRED EMBODIMENTS

Referring to the drawings, certain preferred embodiments of the present invention will be explained in detail.

In a first embodiment, shown in FIGS. 1 to 6, the gate array is of an SOI construction and includes capacitive devices.

Figure 1:
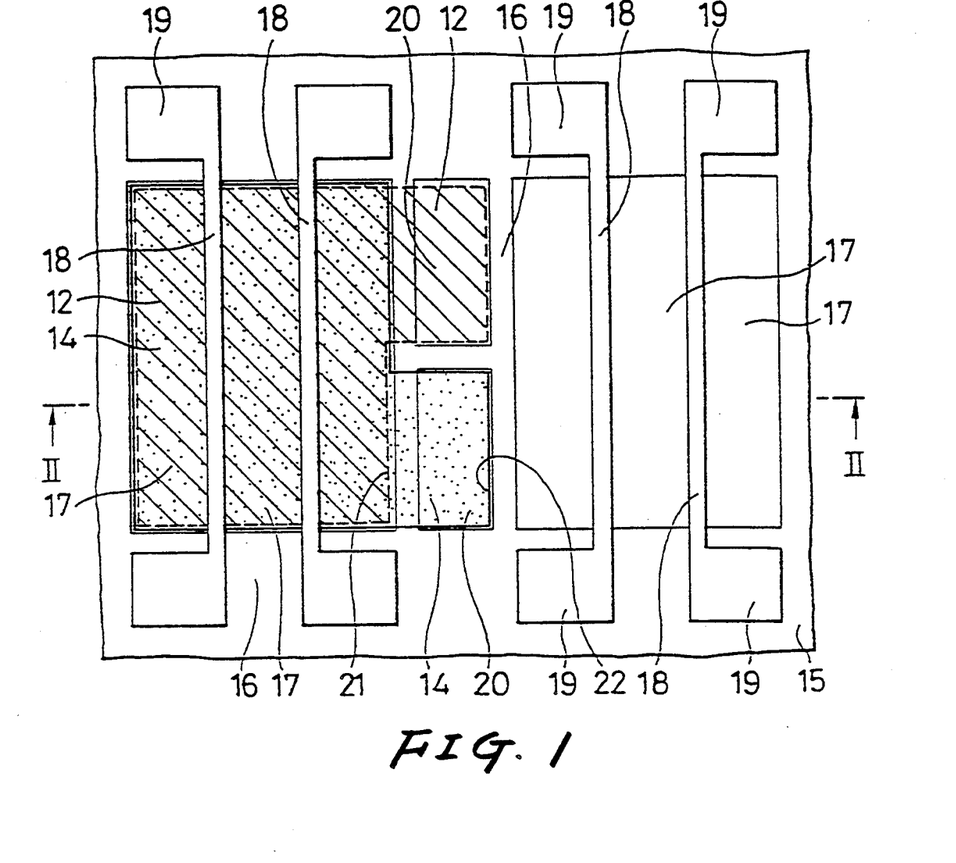
FIG. 1 is a plan view showing essential parts of a semiconductor integrated circuit device according to an embodiment of the present invention.

Referring to FIG. 1, showing essential parts of the present embodiment in a plan view, a plurality of gate electrodes 18, each having a substantially U-shaped cross-section, are formed on a wafer. Each gate electrode 18 has its end sections for metallization 19, 19 in the form of an enlarged square on an insulating layer 15. On both sides of a narrow strip-like region interconnecting the end sections 19, 19, there are formed source and drain regions 17, 17 in the form of rectangles. The source and drain regions 17, 17 are each n+ impurity diffusion regions, formed in a thin silicon section, which silicon section represents a first device-forming region and is formed by wafer grinding as will be explained subsequently. The gate electrodes 18 are arrayed in alternately opposite directions along the channel length. A pair of the adjoining gate electrodes 18, 18 and three of the source and drain regions 17 neighboring to these gate electrodes make up a basic unit cell delimited by the insulating layer 15 functioning as device isolating regions. The lower part of each gate electrode 18 adjacent to the source and drain regions 17, 17 is a channel-forming region lying above the insulating layer 15, so that the MOS transistor is a thin-film transistor having an SOI construction. A number of the basic unit cells are laid all over the chip surface to provide a sea-of-gate construction in which the logic gates are laid on the entire upper surface without vacancies.

In FIG. 1, a capacitor electrode contact sections 20, which is substantially rectangular in plan view, is formed in a region delimited between adjoining basic unit cells. Two such capacitor electrode contact sections 20, 20 are arrayed side by side between adjacent unit cells, and the adjoining capacitor electrode contact regions are isolated from each other by the insulating layer 15, while the adjoining source drain regions 17, 17 are similarly isolated from each other by the insulating layer 15, by way of effectuating device isolation. The capacitor electrode contact sections 20 are n+ type impurity diffusion regions formed in the thin silicon section. These capacitor electrode contact sections 20 are connected at the bottom with capacitor electrodes.

Figure 2:
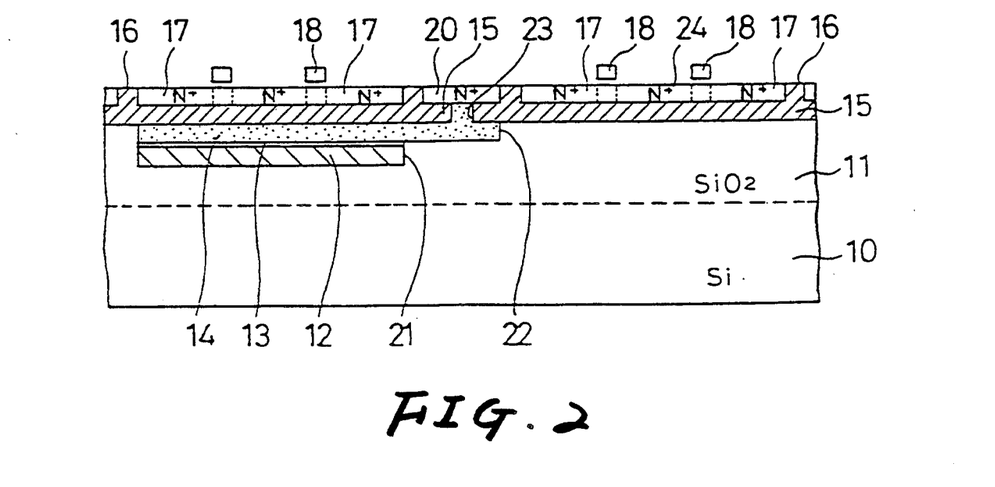
FIG. 2 is a cross-sectional view along line II—II of FIG. 1.

Referring to FIG. 2, showing the cross-section along line II—II of FIG. 1, a silicon oxide insulating layer 11 is formed on a silicon substrate as a supporting substrate and a lower capacitor electrode 12 and an upper capacitor electrode 14 are buried in recesses 21, 22 formed in the insulating layer 11. The interface between the insulating layer 11 and the silicon substrate 10 is also a bonding surface. The recess 21 is a groove delimiting the outer contour of the lower capacitor electrode 12 and is formed at a position deeper than the recess 22. The recess 21 is coextensive as the basic cell in plan view and is extended to a region below one of the capacitor electrode contact sections 20. Thus the lower capacitor electrode 12 is similarly patterned so that it is coextensive as the rectangular basic cell and is additionally extended to a region below the capacitor electrode contact section 20. On the upper surface of the lower capacitor electrode 12 is formed a dielectric film 13 by means of which the lower capacitor electrode 12 is faced by the upper capacitor electrode 14. The recess 22 is a groove delimiting the outer contour of the upper capacitor electrode 14 and is formed at a depth shallower than the recess 21. The recess 22 has an upper surface of the same height level as the upper surface of the insulating layer 11 and has its bottom surface faced by the recess 21 within the extent of the basic cell. The recess 22 is similarly extended to a region below the other capacitor electrode contact section 20, as a result of which the upper capacitor electrode 14 is extended to a position blow the capacitor electrode contact sections 20. The upper surfaces of the upper capacitor electrode 14 and the insulating layer 11 contact the bottom surface of the insulating layer 15. A contact hole 23 is formed in a region of the insulating layer 15 which is disposed below each capacitor electrode contact section 20. It is by these contact holes 23 that the capacitor electrode contact sections 20, 20 are connected to the lower capacitor electrode 12 and the upper capacitor electrode 14.

The insulating layer 15 has a predetermined film thickness and overlies the bottom and the lateral sides of the thin silicon section in which the capacitor electrode contact sections 20 and the source drain regions 17 are formed. The insulating layer 15 is adapted for being partially exposed to a major surface 24. The portions of the insulating layer 15 exposed to the major surface 24 function as device isolating regions and as grinding stop sections 16. A number of gate electrodes 18 are formed on the major surface 24 by means of a gate insulating film, not shown, for providing a channel-less gate array.

With the present gate array, the MOS transistors making up logic gates are of an SOI structure in which the upper capacitor electrode 14, the dielectric film 13 and the lower capacitor electrode 12 are buried in the bottom of the SOI structure. Thus the larger circuit scale may be maintained without the capacitance devices taking up a larger area on the semiconductor chip. The present gate array may be prepared in accordance with a process which will be explained and arranged three-dimensionally by a bonding technique.

Figure 3:
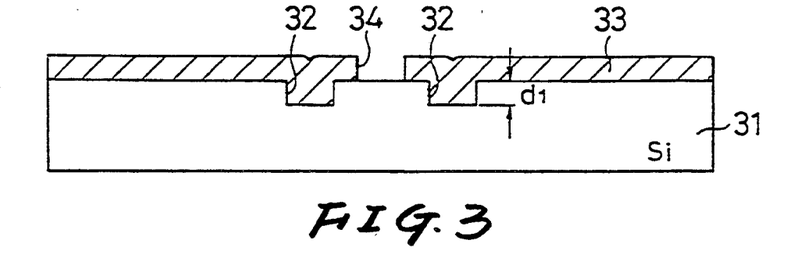
FIG. 3 is a cross-sectional view showing a process up to the step of forming an insulating layer in the method for producing the circuit device shown in FIG. 1.

First, a groove 32 of a depth d1 is formed by, for example, anisotropic etching, in a single crystal silicon substrate 31. This depth d1 corresponds to the thickness of the source drain region of the thin film transistor constituting the logic gate. In a plan layout, the groove 32 is of the same pattern as the device isolating region and also as the grinding stop section.

After formation of the groove 32, an insulating layer 33 is deposited on the entire substrate surface. The groove 32 is filled to its bottom with the material of the insulating layer 33. The insulating layer 33 is apertured at portions thereof where the capacitor electrodes are connected to the capacitor electrode contact sections so that contact holes 34 are formed thereat. A pair of the contact holes 34 are formed per capacitor electrode. The surface of the silicon substrate 31 is exposed at the bottom of the apertured contact hole 34, as shown in FIG. 3. The exposed portions of the silicon substrate 31 are adapted to function subsequently as capacitor electrode contact sections.

Figure 4:
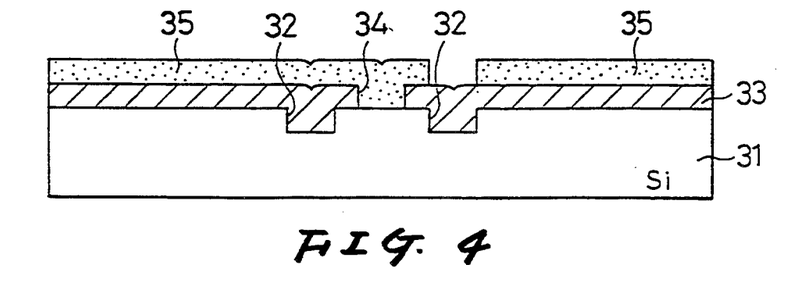
FIG. 4 is a cross-sectional view showing a process up to the step of forming an upper capacitor electrode in the method for producing the circuit device shown in FIG. 1.

A first polysilicon layer 35 doped with impurities is then formed on the entire wafer surface by, for example, a CVD method. This polysilicon layer 35 is patterned using a mask composed of, for example, a selectively exposed and developed photoresist layer, as shown in FIG. 4. This pattern of the polysilicon layer 35 corresponds to the contour of the upper capacitor electrode which will be formed subsequently and which, while being coextensive as the basic unit cell, is extended to the bottom of the above mentioned one of the contact holes 34.

After the polysilicon layer 35 is patterned, a dielectric film 36, such as a silicon oxide film or a silicon oxide-silicon nitride composite film, is formed on the surface of the patterned polysilicon layer 35, and a second polysilicon layer 37, doped with impurities, is formed on the dielectric film 36. Meanwhile, during formation of the polysilicon layer 37, the dielectric film 36 in the bottom of the remaining contact hole 34 not filled with the material of the polysilicon layer 35 is removed. The polysilicon layer 37 is patterned by a photolithographic process. The pattern of the polysilicon layer 37 corresponds to the contour of the lower capacitor electrode which will be formed subsequently, and is such a pattern which overlies the unit cell while being extended to the bottom of the above mentioned other contact hole 34.

Figure 5:
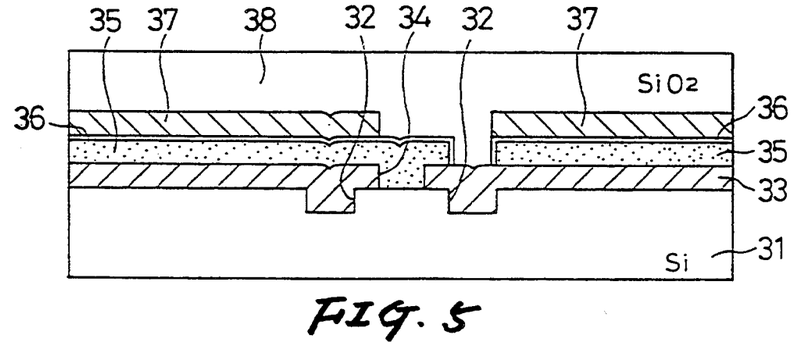
FIG. 5 is a cross-sectional view showing a process up to the step of forming an insulating film in the method for producing the circuit device shown in FIG. 1.

After the polysilicon layer 37 is formed, a thick silicon oxide film 38 is deposited on the entire chip surface, as shown in FIG. 5. The entire chip surface is now buried by the thick silicon oxide film 38. After deposition, the thick silicon oxide layer 38 is planarized by etchback or polishing.

Figure 6:
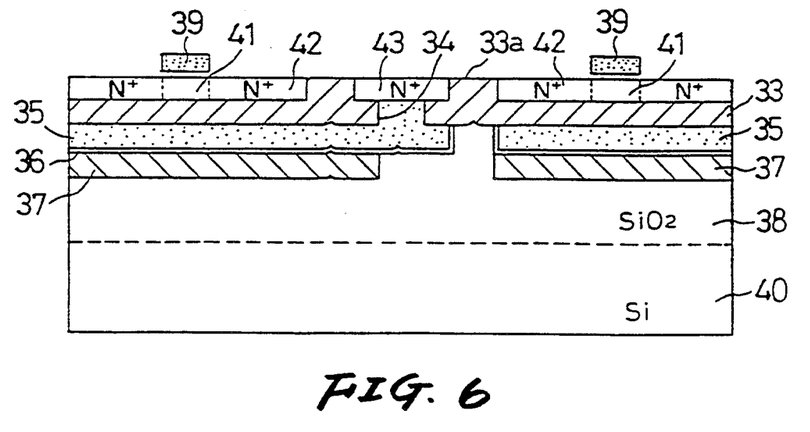
FIG. 6 is a cross-sectional view showing a process up to the step of introducing impurities in the method for producing the circuit device shown in FIG. 1.

After the silicon oxide film 38 is formed, a silicon substrate 40 is bonded to the planarized surface of the silicon oxide film 3. In this manner, the device-forming surface may be supported by the substrate. The silicon substrate 31 is then ground from its un-bonded reverse side. By this grinding, the silicon substrate 31 is gradually reduced in thickness. The grinding is terminated when the surface 33a of the insulating layer 33 is exposed, that is when the grinding stop is exposed. As a result, the thin single-crystal silicon sections 41 is partially left on the ground surface in the insulating layer 33 in the pattern of device isolation. Gate insulating films, not shown in FIG. 6, are formed on the thin single-crystal silicon section 41, and gate electrodes 39 are formed on the gate insulating films in a predetermined pattern. After the gate electrodes 39 are formed, n-type and p-type impurities are selectively introduced by a self-aligned process. By these introduced impurities, the source drain regions 42 are formed, and devices such as nMOS transistors or pMOS transistors, not shown, are formed without vacancies on the entire surface of the semiconductor chip. Impurities are similarly introduced on the thin silicon section above the contact holes 34 for functioning as capacitor electrode contact sections 43.

The semiconductor device thus prepared is processed in a usual manner for metallization so as to be used as a gate array devoted to a particular application.

By the above described process steps, inclusive of the substrate grinding step, the present gate array may be produced as an SOI device having a single crystal semiconductor layer. High integration may be achieved by virtue of the features of the SOI structure. The capacitors as analog hybrid components may also be formed between the insulating layer 33 constituting the bottom of the SOI structure and the insulating film 38 in a superposed relation with respect to the MOS transistors on the surface so that analog hybridization may be achieved without, diminishing the MOS transistor area on the semiconductor chip.

SECOND EMBODIMENT

In the present embodiment, which is modified from the preceding embodiment, the resistance device is buried in an insulating region below the logic gate of the SOI structure.

Figure 7:
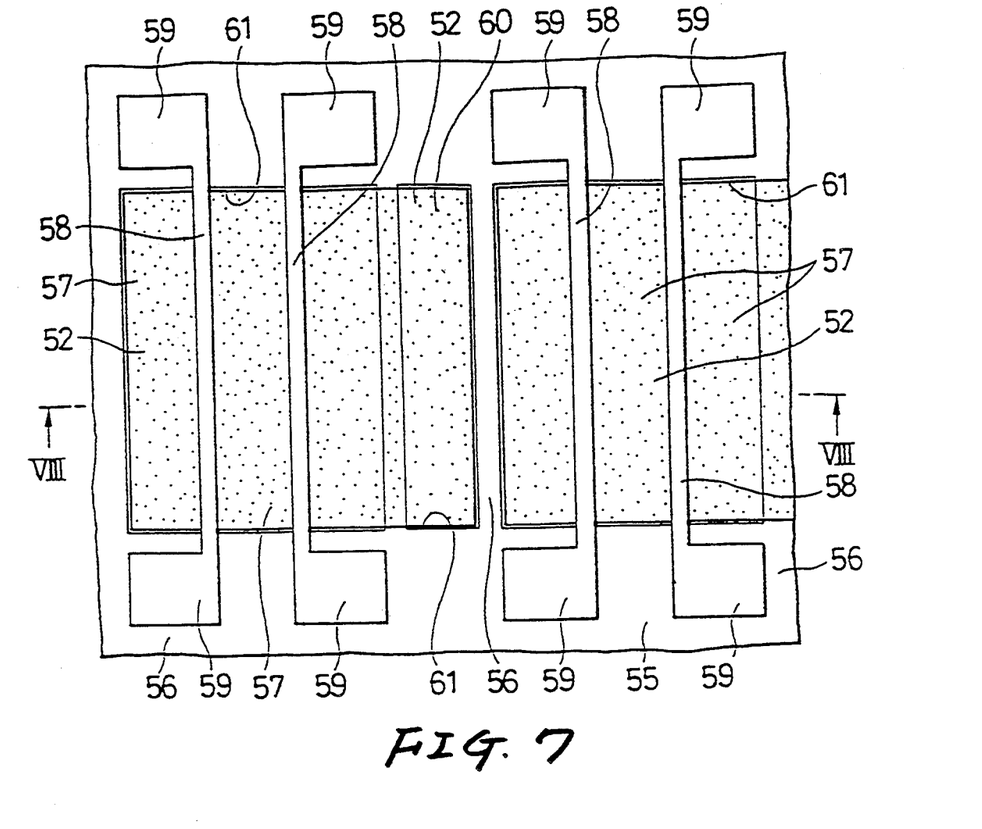
FIG. 7 is a plan view showing essential parts of a semiconductor integrated circuit device according to a modified embodiment of the present invention.

Referring to FIG. 7, showing essential parts of the present embodiment in a plan view, a number of gate electrodes 58 are formed on a substrate in a substantially U-shaped pattern, similarly to the preceding embodiment. Each gate electrode 58 has its end sections 59, 59 enlarged in square shape for metallization. Rectangular-shaped source drain regions 57 are arranged for facing each other with a narrow strip-like region interconnecting the end sections 59, 59 in-between. The source drain regions 57 are n+ type impurity diffusion regions formed in a thin silicon section, which silicon section is a first device-forming region formed by grinding the substrate as will be explained subsequently. The gate electrodes 58 are oriented in alternately opposite directions along the transistor channel. A basic unit cell is delimited by a pair of the gate electrodes 58, 58 and three source drain regions 57 adjoining to the gate electrodes 58, with an insulating layer 55 for device isolation surrounding the electrodes 58 and the source drain regions. The lower part of the gate electrode 58, adjoining to the source drain region 57, is a channel-forming region on the insulating layer 55, so that the MOS transistor is a thin-film transistor comprised of a SOI structure. A number of the basic unit cells are laid without vacancies on the entire chip surface to provide a channel-less sea-of-gate structure.

In FIG. 7, a resistance contact section 60 which is substantially rectangular in plan view is formed in a region between a pair of the basic unit cells. A resistance contact section 60, device-isolated from the adjoining source drain regions 57, is formed as an n+ type impurity diffusion region, formed in the thin silicon section, and is connected at the bottom thereof to a resistance layer 52.

Figure 8:
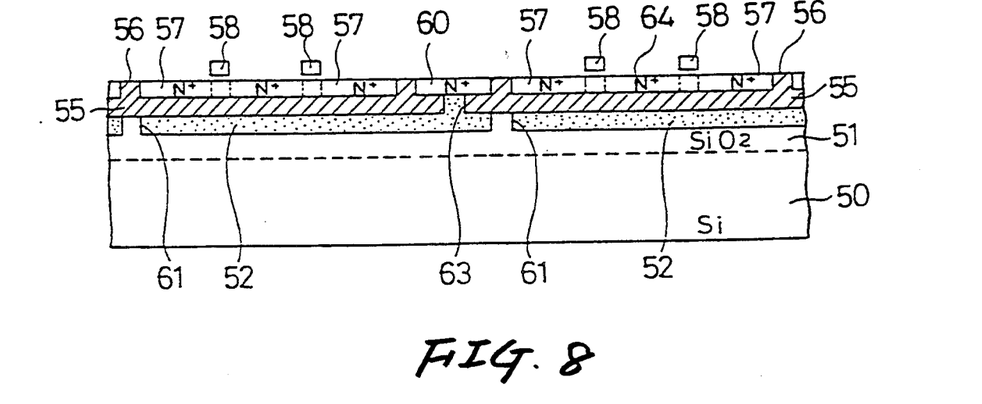
FIG. 8 is a cross-sectional view along line VIII—VIII of FIG. 7.

Referring to FIG. 8, showing the cross-section along line VIII—VIII of FIG. 7, a silicon oxide insulating layer 51 is formed on a silicon substrate 50, functioning as a supporting substrate, and a resistance layer 52 is buried in a recess 61 formed in the insulating layer 51. The interface between the insulating layer 51 and the silicon substrate 50 is also a bonding surface. The recess 61 is a groove delimiting the outer contour of the resistance layer 52 and is coextensive as the basic cell in plan view. The recess 61 is additionally extended to a region below the resistance contact section 60 and hence is substantially square-shaped. Thus the resistance layer 52 is similarly coextensive as the rectangular basic unit cell and additionally extended to a region below the capacitor electrode contact section 60 so that the resistance layer 52 is similarly square-shaped. The upper surfaces of the resistance layer 52 and the insulating layer 51 are in contact with the bottom of the insulating layer 55. A contact hole 63 is formed in the portion of the insulating layer 55 lying below the resistance contact section 60. It is by means of the contact hole 63 that the resistance layer 52 is connected to the resistance contact section 60.

The insulating layer 55 has a predetermined film thickness and overlies the bottom and the lateral sides of the thin silicon section in which the resistance contact sections 60 and the source drain regions 57 are formed. The insulating layer 55 is adapted for being partially exposed to a major surface 64 of a semiconductor chip. The portions of the insulating layer 55 exposed to the major surface 64 function as device isolating regions and as grinding stop sections 56 which are useful when forming the thin silicon section. A number of gate electrodes 58 are formed on the major surface 64 by means of a gate insulating film, not shown, for providing a channel-less gate array. The resistance layer 52 ma also be rectangular-shaped, for example, instead of being square-shaped, as in the present embodiment.

With the present gate array, the MOS transistors making up logic gates are of a SOI structure, in which the resistance layer 52 making up the logic gate is buried in the bottom of the SOI structure. Thus the larger circuit scale may be maintained without the resistance devices taking up a larger area on the semiconductor chip. The present gate array may be produced by the process explained hereinbelow and arranged three-dimensionally by a bonding technique.

Figure 9:
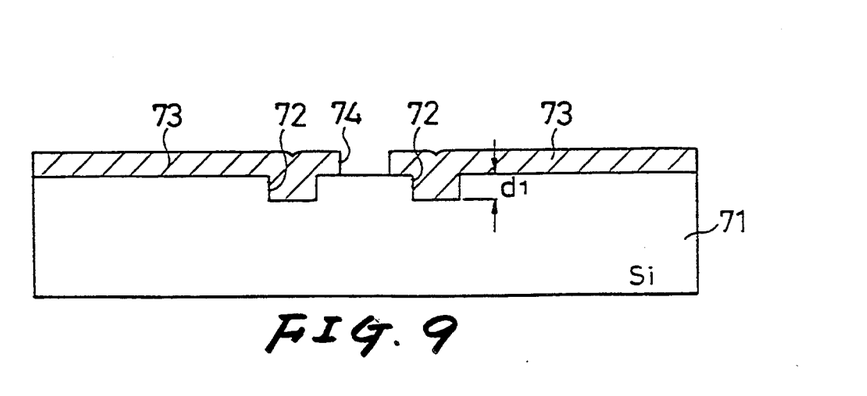
FIG. 9 is a cross-sectional view showing a process up to the step of forming an insulating layer in the method for producing the circuit device shown in FIG. 7.

First, a groove 72 of a depth d1 is formed by, for example, anisotropic etching, in a single crystal silicon substrate 71, as in the preceding embodiment. This depth d1 corresponds to the thickness of the source drain region of the thin film transistor constituting the logic gate. In a plan layout, the groove 72 is the of same pattern as the device isolating region and the grinding stop.

After formation of the groove 72, an insulating layer 73 is deposited on the entire upper substrate surface. The insulating layer 73 is apertured at portions thereof where the resistance devices are connected to the resistance contact sections, so that contact holes 74 are formed thereat. Each one contact hole 74 is formed per resistance device. Alternatively, a pair of terminals may be associated with each resistance device. The surface of the silicon substrate 71 is exposed at the bottom of the apertured contact hole 74, as shown in FIG. 9. The exposed portions of the silicon substrate 71 are adapted for functioning as resistance contact sections subsequently.

Figure 10:
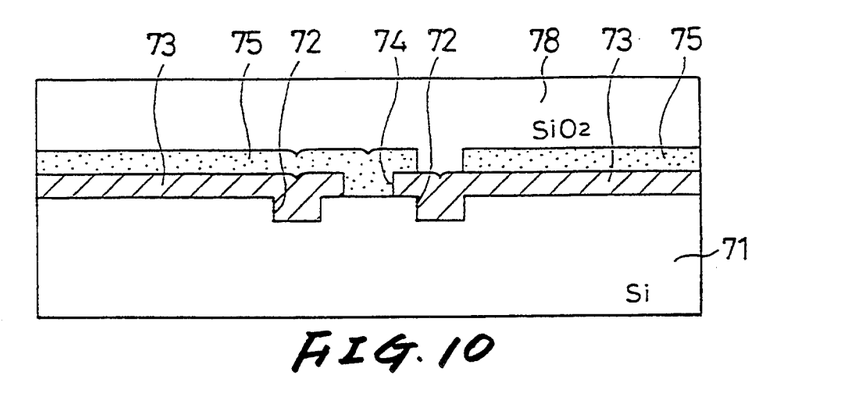
FIG. 10 is a cross-sectional view showing a process up to the step of forming an insulating film in the method for producing the circuit device shown in FIG. 7.

A polysilicon layer 75 doped with impurities is then formed on the entire substrate surface by, for example, a CVD technique. This polysilicon layer 75 is patterned using a mask composed of, for example, a selectively exposed and developed photoresist layer. This pattern of the polysilicon layer 75 corresponds to, the contour of the resistance device which will be formed subsequently and is coextensive as the basic unit cell. Besides, the patter of the polysilicon layer is extended to the bottom of the above mentioned one of the contact holes 74, so that it is substantially a square-shaped pattern. The polysilicon layer 75 is connected to the silicon substrate 71 at the bottom of the contact hole 74. After the polysilicon layer 75 is patterned, a thick silicon oxide film 78 is deposited on the entire chip surface, inclusive of the polysilicon layer 75, as shown in FIG. 10. The thick silicon oxide film 78 thus deposited is then planarized by etchback or polishing.

Figure 11:
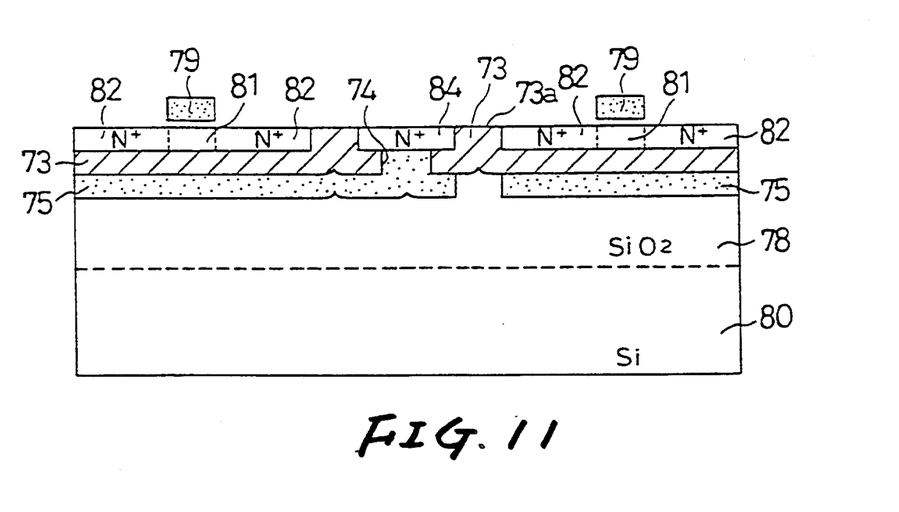
FIG. 11 is a cross-sectional view showing a process up to the step of introducing impurities in the method for producing the circuit device shown in FIG. 7.

After the silicon oxide film 78 is formed, a silicon substrate 80 is bonded to the planarized surface of the silicon oxide film 78. In this manner, the device-forming surface may be supported by the substrate. The silicon substrate 71 is then ground from its reverse side opposite to the bonded surface. By this grinding, the silicon substrate 71 is gradually reduced in thickness. The grinding is terminated when the surface 73a of the insulating layer 73 is exposed, that is when the grinding stop is exposed. As a result, a thin single-crystal silicon sections 81 is partially left on the ground substrate surface in the insulating layer 73 in the pattern of device isolation. Gate insulating films, not shown in FIG. 11, are formed on the thin single-crystal silicon sections 81, and gate electrodes 79 are formed on the gate insulating films in a predetermined pattern. After the gate electrode 79 is formed, n-type and p-type impurities are selectively introduced by a self-aligned process. By these introduced impurities, the source drain regions 82 are formed, and devices such as nMOS transistors or pMOS transistors, not shown, are formed without vacancies on the entire surface of the semiconductor chip. Impurities are similarly introduced on the partially left thin silicon section 81 above the contact hole 74 for functioning as capacitor electrode contact sections 84.

The semiconductor device thus prepared is processed in a usual manner for metallization so as to be used as a gate array devoted to a particular application.

By the above described process steps, inclusive of the substrate grinding step, the present gate array may be produced as a SOI device having a single crystal semiconductor layer. High integration may be achieved by virtue of the features of the SOI structure. The capacitors as analog hybrid components may also be formed below the insulating layer 73 constituting the bottom of the SOI structure in superposition on the MOS transistor so that analog hybridization may be achieved without diminishing the MOS transistor area on the semiconductor chip.

Although the capacitance devices or resistance devices are formed in the first and second embodiments in the lower parts of the logical gates of the channel-less SOI structure, both the capacitance devices and the resistance devices may also be formed in the lower parts of the logical gates of the channel-less SOI structure.

In addition, although the resistance layer is formed as a single layer, it may also be formed as a dual layer. If the resistance layer is formed in one and the same chip with the capacitance device, it suffices if the dielectric film between the counter electrodes of the capacitance device is removed partially or entirely. The resistance device and the capacitance device may also be stacked together.

What is claimed is:

1. A semiconductor integrated circuit device comprising:
   a supporting substrate,
   a second device-forming region containing plural passive devices made up of a semiconductor layer or a conductive layer formed on said supporting substrate,
   a first device-forming region which is formed by grinding a substrate and in which a plurality of logical gates are arrayed,
   each of said passive devices being connected to an individual one of said logical gates, and
   an insulating layer formed between said first device-forming region and said second device-forming region and provided with a grinding stop for stopping substrate grinding,
   said first device-forming region and said second device-forming region being electrically connected to each other at certain regions,
   wherein said plurality of logical gates formed in said first device-forming region have no region which is not directly opposite said insulating layer from a portion of said passive devices formed in said second device-forming region.

2. A semiconductor integrated circuit device as claimed in claim 1 wherein each said logic gate is a MIS transistor and the connected device formed in said second device-forming region is a capacitive element.

3. A semiconductor integrated circuit device as claimed in claim 1 wherein each said logic gate is a MIS transistor and the connected device formed in said second device-forming region is a resistance element.

4. A semiconductor integrated circuit device as claimed in claim 1 wherein each said logic gate is a MIS transistor and the connected device formed in said second device-forming region is a combination of a capacitance element and a resistance element.

5. A semiconductor integrated circuit device as claimed in claims 2, 3 or 4 wherein said MIS transistors are formed on the entire surface of said first device-forming region.

* * * * *